United States Patent
Tischler et al.

(10) Patent No.: US 8,748,219 B2
(45) Date of Patent: Jun. 10, 2014

(54) METHOD AND APPARATUS FOR SUPER RADIANT LASER ACTION IN HALF WAVELENGTH THICK ORGANIC SEMICONDUCTOR MICROCAVITIES

(75) Inventors: Jonathan R. Tischler, Bnei Brak (IL); Elizabeth R. Young, Cambridge, MA (US); Daniel G. Nocera, Winchester, MA (US); Vladimir Bulovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 101 days.

(21) Appl. No.: 13/061,950

(22) PCT Filed: Sep. 8, 2009

(86) PCT No.: PCT/US2009/056267
§ 371 (c)(1),
(2), (4) Date: May 23, 2011

(87) PCT Pub. No.: WO2010/028390
PCT Pub. Date: Mar. 11, 2010

(65) Prior Publication Data
US 2011/0235668 A1      Sep. 29, 2011

Related U.S. Application Data

(60) Provisional application No. 61/095,293, filed on Sep. 8, 2008.

(51) Int. Cl.
*H01L 51/40*          (2006.01)
(52) U.S. Cl.
USPC ............................................... 438/99; 257/40
(58) Field of Classification Search
USPC ................ 257/40; 438/99; 313/504; 428/690
See application file for complete search history.

(56) References Cited

U.S. PATENT DOCUMENTS 6,160,828 A * 12/2000 Kozlov et al. .................. 372/39
6,294,398 B1    9/2001 Kim et al.
(Continued)

FOREIGN PATENT DOCUMENTS

| DE | 10 2007-16995 | 10/2008 |
| WO | WO 03-073164 | 9/2003 |
| WO | WO 2004-107403 | 12/2004 |

OTHER PUBLICATIONS

G. Y. Zhong, J. He, S. T. Zhang, Z. Xu, Z. H. Xiong, H. Z. Shi, X. M. Ding, W. Huang, and X. Y. Hou, In situ photoluminescence investigation of doped Alq, Appl. Phys. Lett. 80, 4846 (2002).*

(Continued)

*Primary Examiner* — Mark Tornow
(74) *Attorney, Agent, or Firm* — Salehi Law Group

(57) ABSTRACT

The disclosed device is a solid state organic semiconductor VCSEL in which the microcavity is composed of metal and dielectric mirrors and the gain layer is only $\lambda/2n$ thick. The gain layer comprises a thermally evaporated 156.7 nm thick film of the laser dye DCM doped (2.5% v/v) into an $Alq_3$ host matrix. The microcavity consists of 2 mirrors, a dielectric Bragg reflector (DBR) sputter-coated onto a quartz substrate as the mirror through which the organic gain layer is optically excited and laser emission is collected and a silver mirror that is thermally evaporated on top of the $Alq_3$:DCM film. The device exhibits laser action from the DCM both when the DCM molecules are excited directly at 535 nm and via Förster Resonance Energy Transfer (FRET) from the $Alq_3$ (excited at 404 nm) with laser thresholds of 4.9 $\mu J/cm^2$ and 14.2 $\mu J/cm^2$ respectively.

12 Claims, 11 Drawing Sheets

(56) References Cited

U.S. PATENT DOCUMENTS

| | | | |
|---|---|---|---|
| 6,444,400 | B1 | 9/2002 | Cloots et al. |
| 6,472,962 | B1 | 10/2002 | Guo et al. |
| 6,498,802 | B1 | 12/2002 | Chu et al. |
| 6,586,763 | B2 | 7/2003 | Marks et al. |
| 7,346,981 | B2 | 3/2008 | Borwick et al. |
| 7,406,761 | B2 | 8/2008 | Jafri et al. |
| 7,836,574 | B2 | 11/2010 | Jafri et al. |
| 2002/0045105 | A1 | 4/2002 | Brown et al. |
| 2004/0004988 | A1 | 1/2004 | Cok et al. |
| 2005/0230348 | A1 | 10/2005 | Kido |
| 2006/0048885 | A1 | 3/2006 | Constantin |

OTHER PUBLICATIONS

Minghong Yang et al, Optical thin films with high reflectance, low thickness and low stress for the spectral range from vacuum UV to near IR, 2006 J. Opt. A: Pure Appl. Opt. 8 327.*

Jonathan R. Tischler, M. Scott Bradley, Yasuhiro Shirasaki, and Vladimir Bulovic, Exciton-Polaritons at Room Temperature in Dielectric Microcavities Exhibiting Rabi-Splitting Exceeding $\Omega R > 100$ meV, Conference Paper, Quantum Electronics and Laser Science Conference, Baltimore, Maryland, May 6, 2007.*

Jakabovic, J.; Wong, T.C.; Lengyel, O.; Kovac, J.; Lee, C.S.; Lee, S.T.; , "Optical properties investigations of organic Alq3 layers doped by DCM," Advanced Semiconductor Devices and Microsystems, 2002. The Fourth International Conference on , vol., no., pp. 35-38, Oct. 14-16, 2002.*

S. Riechel, U. Lemmer, J. Feldmann, S. Berleb, A. Mückl, W. Brütting, A. Gombert, and V. Wittwer, "Very compact tunable solid-state laser utilizing a thin-film organic semiconductor," Opt. Lett. 26, 593-595 (2001).*

J. Lam, T. C. Gorjanc, Y. Tao, and M. D'Iorio, Selective doping of multilayer organic light emitting devices, J. Vac. Sci. Technol. A 18, 593 (2000).*

International Search Report and Written Opinion dated Mar. 29, 2010 issued for PCT Application No. PCT/US2009/056267.

Hanseup Kim et al., "Characterization of Aligned Wafer-Level Transfer of Thing and Flexible Parlene Membranes", *Journal of Microelectromechanical Systems*, Dec. 1, 2007, vol. 16, No. 6, pp. 1386-1396.

Meitl et al., "Transfer Printing by Kinetic Control of Adhesion to an Elastometric Stamp," *Nature Materials Nature Publishing Group UK*, vol. 5, No. 1, Jan. 2006, pp. 33-38.

International Preliminary Report on Patentability issued on Oct. 6, 2009 for PCT Application No. PCT/US09/030151.

International Preliminary Report on Patentability issued on Feb. 8, 2011 for PCT Application No. PCT/US09/053086.

International Search Report and Written Opinion dated Dec. 10, 2010 issued for PCT Application No. PCT/US2009/067801.

* cited by examiner

METHOD AND APPARATUS FOR SUPER RADIANT LASER ACTION IN HALF WAVELENGTH THICK ORGANIC SEMICONDUCTOR MICROCAVITIES

CROSS REFERENCE TO RELATED APPLICATIONS

This disclosure claims the filing date benefit of U.S. Provisional Application No. 61/095,293, filed Sep. 8, 2008, the specification of which is incorporated by reference herein in its entirety.

BACKGROUND

1. Field of the Invention

The disclosure relates to a method and apparatus for producing super radiant laser in a half wavelength thick organic semiconductor microcavity.

2. Description of Related Art

Microcavity lasers that utilize solid state organic semiconductors as the gain medium hold promise for a wide range of applications, including chemical sensors and single molecule detectors for biological applications. Such devices also serve as a platform for investigating fundamental physical phenomena such as energy transfer and room temperature condensation of excitons, and a test-bed for developing electrically pumped solid state organic lasers. The very large absorption cross sections of organics suggest that these materials may also be useful as part of communications switching elements and compact sources of non-classical light (e.g., quantum optics).

A number of research groups investigated the lasing properties of organic laser dyes in optical microcavities. The laser dyes were dissolved in solutions which were then flowed into the space between two dielectric (sputter-coated) minors. The spacing between the minors was adjusted either through piezoelectric nano-positioners or through metal spacer layers of precision thickness, such that the gain region thickness had a value equal to $\lambda/2n$ or an integer multiple thereof.

One observation was an anomalously low lasing threshold, which was attributed to XYZ/super-radiance physical effects and even reported "thresholdless" lasing in the device which had $\lambda/2n$ thick gain region. The lack of a distinct threshold in the input-output power dependence of the $\lambda/2n$ has been confirmed. They also determined that there was nevertheless a clear threshold associated with the polarization of the emitted light and that above a given pump pulse energy, the polarization of the emitted light followed the polarization of the pump laser.

In the late 1990's, researchers began developing organic-based microcavity lasers using solid state materials. For example, lasing was achieved in a metal dielectric Bragg reflector ("DBR") based microcavity that contained the laser dye molecule 4-dicyanomethylene-2-methyl-6-p-dimethylamino-styryl-4H-pyran ("DCM") as the gain material which was doped into an $Alq_3$ host matrix. The $Alq_3$ host was optically pumped with a 337 nm Nitrogen laser, which in turn excited the DCM molecules via the so-called Forster resonance energy transfer ("FRET"). The gain layer thickness needed to be on the order of $1.5\lambda/n$ to provide sufficient gain in order to reach a threshold, which was measured to be 0.3 mJ/cm$^2$. Lasing with the fluorescent conjugated polymer PPV in an all dielectric (2 DBR based) $\lambda/2n$ microcavity showed 80% polarized emission above a threshold of 15 µJ/cm$^2$. The reduced threshold was attributed to the high quality factor ("Q") of the microcavity (i.e., Q value of about 1200).

More recently, $Alq_3$:DCM gain layer with thickness of about $1.5\lambda/n$ was integrated into an all dielectric microcavity and demonstrated lasing with a threshold of 20 µJ/cm$^2$, using a frequency doubled pulsed Ti:Sapphire laser. The reduction in threshold compared to the metal-DBR based microcavity described above can be attributed to the high Q of the all-dielectric microcavity (i.e., Q of about 4500). There remains a need for a microcavity lasing device with Q value which can overcome the optical losses and achieve lasing. There is also a need for a method and apparatus to reduce the Q value.

SUMMARY OF THE INVENTION

In one embodiment, the disclosure relates to a method for forming a microcavity lasing device by depositing a dielectric Bragg reflector ("DBR") layer over a polished quartz substrate; thermally evaporating an organic gain layer having Alq3 doped with the laser dye DCM 2.8 wt. %; forming a silver mirror by thermal evaporation over Alq3:DM layer. The organic gain layer is designed to have a center wavelength ($\lambda_c$) of about 595-605 nm. In a preferred embodiment, the organic gain layer has a thickness of about 156.7 nm. In another embodiment, the lasing device is pumped at a rate of about 140-200 fsec.

In another embodiment, the disclosure relates to an organic semiconductor laser device, comprising: a substrate supporting a dielectric Bragg reflector ("DBR"), the DBR layer having a plurality of low and high refractive index layer pairs; an organic gain layer having $Alq_3$ doped with the laser dye DCM 2.8 wt. %; a silver minor formed over the organic gain layer. The organic gain layer thickness is related to the laser device's wavelength through the relationship $L_c=\lambda/2n$, where n is the refractive index of the organic gain layer and $\lambda$ is the wavelength of the organic gain layer. The DBR has a center wavelength ($\lambda_c$) of about 595-605 nm and quality factor (Q) of about 200.

BRIEF DESCRIPTION OF THE DRAWINGS

These and other embodiments of the invention will be described with reference to the following non-limiting and exemplary illustrations, in which like elements are numbered similarly, and in which.

DETAILED DESCRIPTION

The organic lasing devices disclosed herein exhibit laser threshold excitation densities that are equal or lower than conventional organic lasing devices. This suggests that the low threshold of the disclosed devices is not the result of a modest Q, but rather is the result of the coherent excitonic processes that are generated by optically pumping the device with 150 fsec laser pulses. The optical pumping rate is faster than the Stokes shift and the decoherence time of the DCM molecules. Thus, even when high Q cavities were utilized, the short optical pulses of the pump laser were likely exciting coherent excitonic processes that played a role in the threshold reduction.

Figure 1A:
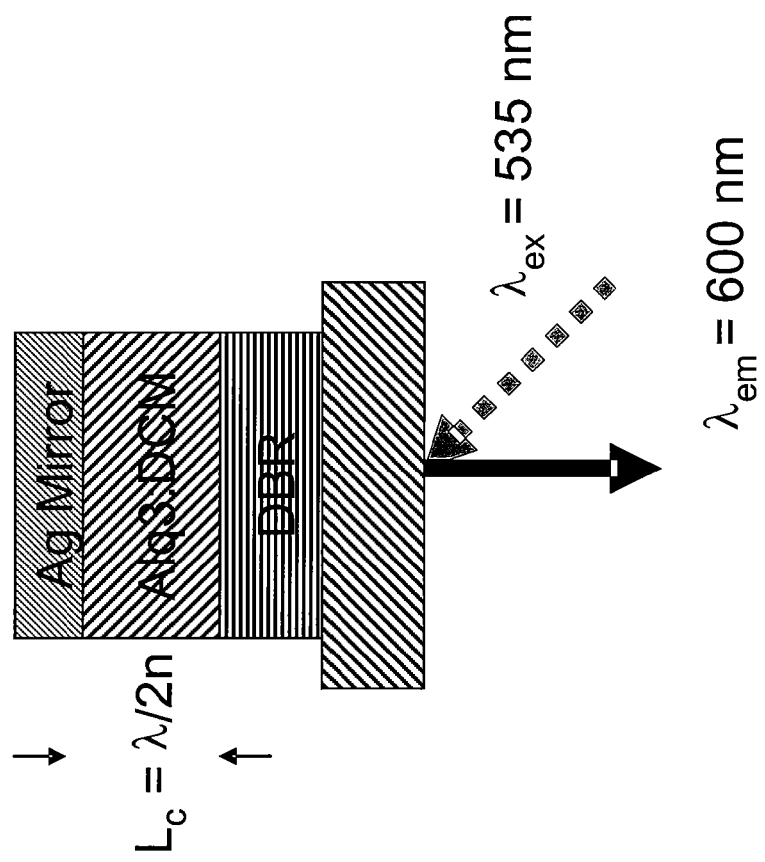
FIG. 1A is a schematic illustration of an organic semiconductor microcavity laser device architecture according to one embodiment of the invention.

FIG. 1A is a schematic illustration of an organic semiconductor microcavity laser device architecture according to one embodiment. In FIG. 1A, a DBR layer is deposited onto a polished quartz substrate, followed by a thermally evaporated organic gain layer comprising an $Alq_3$ doped with the laser dye DCM 2.8 wt. %, over the gain layer. In an embodiment, the DBR layer is designed to have a stop-band centered at or near the lasing wavelength, i.e. a center wavelength 2 between 595 nm to 605 nm. Finally, a silver mirror is formed as the top layer.

In one embodiment, the organic gain layer comprises a plurality of paired layers with each pair layer defining a pairing of a high refractive index material with a low refractive index material. An exemplary high refractive index material is $TiO_2$, which has refractive index of about 2.41. An exemplary low refractive index material is $SiO_2$ which has a refractive index of about 1.46. The high and low refractive index layers that constitute the DBR stack can have thicknesses $\lambda_c/4n_i$ for the $i^{th}$ layer.

In an exemplary implementation, the organic gain layer was formed by co-evaporating Alq3 and DCM. The two constituents were placed in separate metal containers that were then heated using separate power supplies. The thermal evaporator contained 2 quartz crystal thickness monitors. One was located directly above the DCM source in order to measure the small deposition rates of the dopant. The second was situated next to the substrate rotational stage and measured the combined deposition rate of $Alq_3$ and DCM.

The upper thickness monitor was first calibrated twice for $Alq_3$. Next, the lower and upper thickness monitors were both calibrated for DCM. Calibration samples were prepared by growing a nominal 50 nm thick film of the material on a silicon substrate and then measuring the thickness. The $Alq_3$ thickness was measured using 632 nm laser, while the DCM was measured using a 830 nm laser so as to avoid absorption by the DCM. The ellipsometer measurements were further confirmed using a profilometer.

A thick silver layer of more than 500 nm was deposited over the organic gain layer. The substational thickness enabled the silver film to serve both as a heat sink and as a package layer. Without a thick silver film the device may rapidly degrade in air or the pump laser may ablate a hole through the top reflector at high excitation power densities. The thickness of the gain layer was selected to tune the cavity resonance to $\lambda=600$ nm. The gain layer had a refractive index of 1.75 and hence $\lambda/2n=171.4$ nm was the expected cavity thickness. Finally, an adjustment was made to account for the 26 nm of penetration of the optical field into the silver layer at $\lambda=600$ nm. Hence, at n=1.75, the cavity was grown to 14.9 nm thinner for a total thickness of 171.4-14.9=156.7 nm.

Figure 1B:
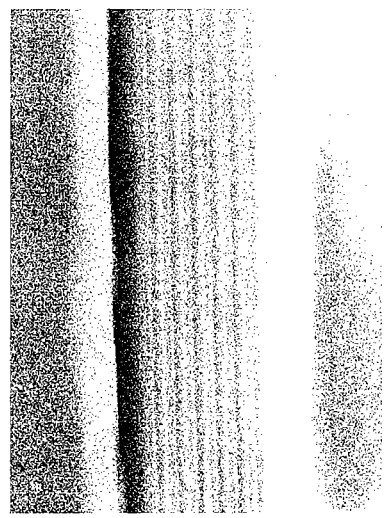
FIG. 1B is a magnified cross section of a microcavity laser having the architecture of FIG. 1A.

FIG. 1B is a cross sectional of the microcavity layer prepared above from a scanning electron microscope ("SEM"). A cuboidal void was first etched using focused ion beam milling (with gallium atoms). The SEM image was then taken with the sample tilted at 45 degrees to image inside the void.

The experiment below demonstrates a lasing process in a microcavity which has a Q value of about 200, utilizing a gain layer that is only $\lambda/2n$ thick as described above.

Experiment

The experimental set-up utilized to characterize the device excited the device at $\theta=60°$ from normal. The electric field of the excitation laser was polarized parallel to the plane of the optical table. Effective coupling of light into the device was achieved by polarizing the pump laser in this manner (as confirmed by determination of the angular dependence of the optical resonance using variable angle specular reflectance measurements with both vertically and horizontally polarized light).

The pump beam was directed through an iris of diameter d=0.25 cm (Area=0.049 cm$^2$) and focused using a 4" focal length lens to a spot size of 0.001 cm$^2$, as measured along the surface of the sample. Excitation was performed with 404 nm or 535 nm photons (see FIG. 1A). Care was taken to maintain stable pump power during the duration of the measurement. The incident power is measured using a power meter, designed for power measurements in pulsed laser systems.

Two pump lasers were used in this experiment. The first was a frequency doubled Ti:Sapphire system which delivered pulses of 7 µJ energy of $\lambda=404$ nm light with pulse duration of 150 fsec pulses at a rep-rate of 1 kHz. The second was an optical parametric oscillator ("OPO") that was used to generate pulses of 6 µJ energy of $\lambda=535$ nm light with pulse duration of 150 fsec pulses at a rep-rate of 1 kHz. The near UV pulsed laser, at $\lambda=404$ nm, was used to excite the sample via excitation of the $Alq_3$ layer, while the $\lambda=535$ nm OPO generated laser was used to excite the DCM within the stop-band wavelength range of the DBR, and effectively excited only the DCM molecules by-passing the $Alq_3$ FRET related processes.

For ambient temperature measurements, the sample was mounted on an XYZ translational stage. The emitted light was detected using an optical fiber mounted onto a rotational stage such that emission could be collected as a function of angle. The rotational stage was aligned with the axis of rotation coincident with the point of optical excitation on the sample. Detecting polarization dependence of the emitted light was achieved using a rotatable polarizer mounted between the sample and the detecting optical fiber.

The excitation source for photoluminescence measurements was a chirped-pulse amplified Ti:Sapphire laser system. In this experiment, the 150-f·sec, 810-nm output of the regenerative amplifier was frequency-up-converted in a visible optical parametric amplifier (BMI Alpha-1000) to produce a 1 kHz pulse train of excitation pulses at 535 nm for resonant excitation of the DCM. Alternatively, for resonant excitation of the $Alq_3$, the 810-nm output of the regenerative amplifier was frequency doubled using a BBO crystal to produce excitation pulses at 405 nm. The excitation was vertically polarized and attenuated to 1 nJ/pulse-1 µJ/pulse.

The steady-state emission was spectrally resolved in a Jobin-Yvon Triax 320 monochromator. Photoluminescence from the device was collected (at normal) by a liquid light guide to spatially homogenize the beam. The beam was spectrally resolved in the monochromator using a high resolution grating (300 grooves/mm) or a low resolution grating 100 grooves/mm) and recoded on a CCD camera. Integration time was about 0.5-2 sec. on the CCD camera.

Luminescence lifetime kinetics were measured on a Hamamatsu C4334 Streak Scope streak camera. The emission was collected with a fiber at normal to the sample and introduced to the detector over a 140-nm window. A 2-ns or a 20-ns time base was used.

Variable temperature steady-state and time resolved emission measurements were also obtained (as described in Hodgkiss, J. M.; Damrauer, N. H.; Pressé, S.; Rosenthal, J.; Nocera, D. G. *J. Phys. Chem. B.* 2006; 110, 18853-18858). A modular cryogenic refrigeration system consisting of a single stage helium compressor connected via hoses to an expander module with a heating element and temperature controller were used to achieve designated temperatures.

The expander module was housed within in laboratory interface comprising a vacuum shroud with glass windows for emission spectroscopy in a right-angle configuration and is continuously pumped to maintain a vacuum (about $10^{-4}$ ton). The device was mounted on a copper block and the thermocouple was calibrated at three temperatures: liquid nitrogen (77° K), an ice bath (273° K) and ambient temperature (293° K). Luminescence measurements were made following a 20 minute wait time after the temperature was adjusted and the sample was allowed to reach equilibrium. Time-resolved emission profiles for the device above and below threshold were determined from streak camera data analysis by integrating 3-nm slices centered on the emission peak from the device.

Results

Optical excitation of the device was performed with 535-nm and 404-nm photons and the output photoluminescence was collected and imaged as described above. An input-output power dependence was performed for both excitation wavelengths and showed supra-linear behavior above a threshold excitation density.

Figure 2:
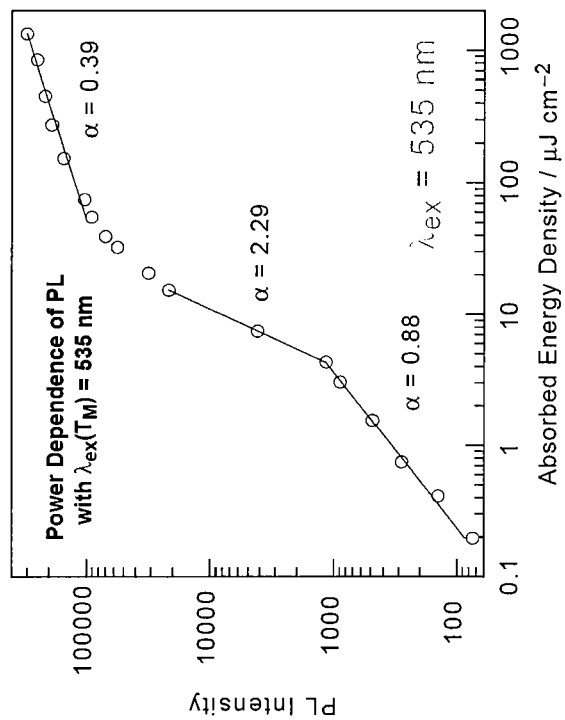
FIG. 2 is a diagram showing the relationship between absorbed energy of a microcavity laser and its photoluminescence intensity upon excitation at $\lambda_{ex}$ of about 535 nm.

FIG. 2 shows the input-output power dependence with excitation at 535 nm, which excites the DCM molecules directly and yields a threshold at 4.9 µJ/cm². Above this excitation level, the forward photoluminescence ("PL") rises rapidly as a function of excitation, and then eventually saturates at an excitation level of ~50 µJ/cm².

Figure 3:
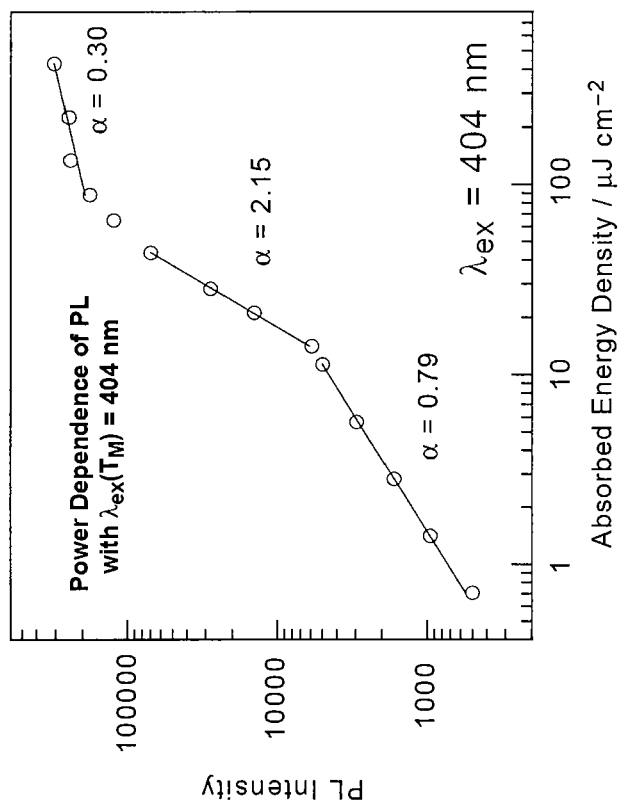
FIG. 3 shows the input/output power dependence upon excitation at $\lambda_{ex}$ of about 404 nm.

FIG. 3 plots the input-output power dependence when the sample is excited with 404 nm photons. Here, the threshold is reached at 14.2 µJ/cm², with the PL signal rising superlinearly with excitation. FIGS. 2 and 3 are plotted in a log-log format and each of the three regions observed (i.e., pre-threshold, threshold and above-threshold) are fit to a power law of the form:

$$y=Ax^\alpha \quad (1)$$

In Equation 1, A is a measure of coupling into the sample and α is power dependence of the input-output response. The input-output power dependence with 535-nm excitation shows a power dependence of α=0.88 pre-threshold; α=2.29 at threshold; and α=0.39 above-threshold.

Excitation with 404 nm photons reveals a similar power dependence in the three regions that are α=0.79 pre-threshold; α=2.15 at threshold; and α=0.30 above-threshold. In the case of 404 nm excitation, the Alq₃ host absorbs the majority of the pump light and transfers the energy non-radiatively via a FRET mechanism to the DCM molecules. Both modes of excitation reveal a mathematical dependence describing the superlinear region of output PL that is described by:

$$PL \sim Ip^{2.2} \quad (2)$$

Equation 2 indicates that in both cases DCM acts as the gain material to reach lasing and that the FRET process efficiently funnels excitons from Alq₃ to DCM.

FRET pumping generally requires a higher threshold excitation density. To some extent the higher threshold can be explained by the fact that higher energy photons are being used to pump the structure, although this would only account for about a 30% increase. The observed 190% increase may be attributed to the FRET process, which introduces a slight delay in achieving excitation of the DCM. Formation of the requisite DCM exciton density via FRET occurs over a slightly longer time and with additional energy loss in comparison to direct pumping of the DCM with 535-nm photons of about 1-2 p·sec. in the pathway from pump excitation to the DCM PL excited state, which must then be compensated for by exciting a greater number of host molecules.

Figure 4:
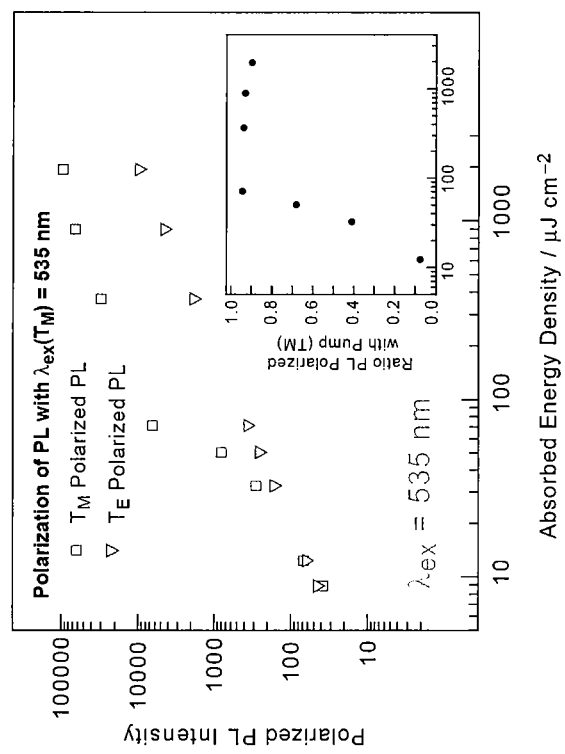
FIG. 4 shows the polarization of emission as a function of input power upon excitation at $\lambda_{ex}$ of about 535 nm.

FIG. 4 shows polarization of emission as a function of input power ($\lambda_{ex}$=535 nm). PL intensity at emission peak is measured with collection polarizer oriented either parallel (TM, □) or perpendicular (TE, ∇) to the pump polarization. TM polarized collection reveals a threshold 25 µW with an on-set of superlinear power dependence. TE polarized light only shows threshold behavior at excitation levels above 100 uW. Inset: Percentage PL intensity polarized co-linearly (TM) to the pump laser, ●, as a function of incident power. Above threshold, nearly 95% of light is TM polarized.

When the device is pumped above threshold, the emitted light becomes spectrally narrowed and polarized with the same polarization as the pump laser. This shows that for 535 nm excitation at threshold, the portion of the PL signal that is polarized parallel to the pump begins to rise much more rapidly than the perpendicularly polarized portion, and that well above threshold over 95% of the PL signal is polarized parallel to the pump (cross-polarized piece rising). With the polarizer oriented parallel to the pump and using a high resolution grating with 0.1 mm slit the PL spectra was measured as function of excitation density.

Figure 5:
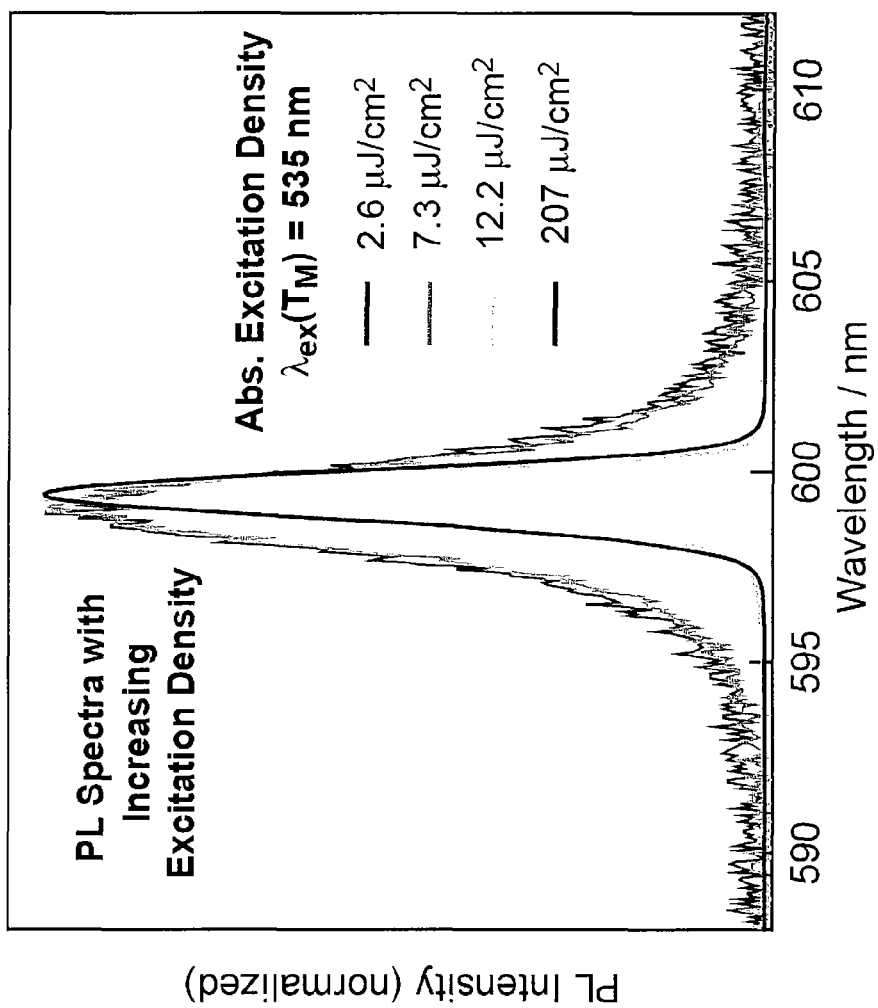
FIG. 5 shows the emission spectrum of a microcavity laser at different power levels relative to the threshold upon excitation at $\lambda_{ex}$ of about 535 nm.

FIG. 5 is the emission spectrum of microcavity laser at different power levels relative to threshold ($\lambda_{ex}$=535 nm). It can be seen that the line-width narrows from 2.5 nm for excitation below threshold (—, 2.6 µJ/cm²; —, 7.3 µJ/cm² to 1.1 nm when excited above threshold (—, 12.2 µJ/cm²; —, 207 µJ/cm²). The spectra was captured using high resolution grating, with excitation and PL detection adjusted to TM polarization.

FIG. 5 also shows that the PL emission line-width narrows from a FWHM=2.5 nm (below threshold) to FWHM=1.1 nm (for 62 uW and up). Polarized emission is also observed when the device is excited using 404 nm pulses above threshold. In this case (see FIG. 6), the PL signal becomes at most 60% polarized. It is remarkable that the PL is at all polarized considering the DCM is being excited via FRET from Alq₃. The polarization of the Alq₃ host/donor molecules is conferred to the DCM guest/acceptor molecules because the FRET process which happens within a few picoseconds, is occurring on the same time scale as the decoherence time of Alq₃, and it is orientation-specific.

In addition to spectral narrowing and a high degree of polarization, we observed that above threshold a directed beam emerges normal to the substrate with a high degree of collimation. The polar plot of the emission peak as function of angle (FIG. 7) shows that below threshold the PL counts is at half-maximum at ±30°. Above threshold, the PL narrows to ±5°. The wavelength corresponding to the PL emission peak shifts to shorter wavelength as the emission is collected at larger angle.

A red-shifted emission peaks appears in the PL spectra above threshold (see FIG. 10), which also shows the same polarization as the central lasing line. The presence of such a peak suggests that condensation of excitons is occurring.

Time-resolved PL measurements were performed below and above threshold for both 404 nm and 535 nm excitation wavelengths. The emission spectra using 404 nm pulsed excitation are plotted in FIG. 8 with each streak-camera trace normalized to the maximum in intensity.

Figure 6:
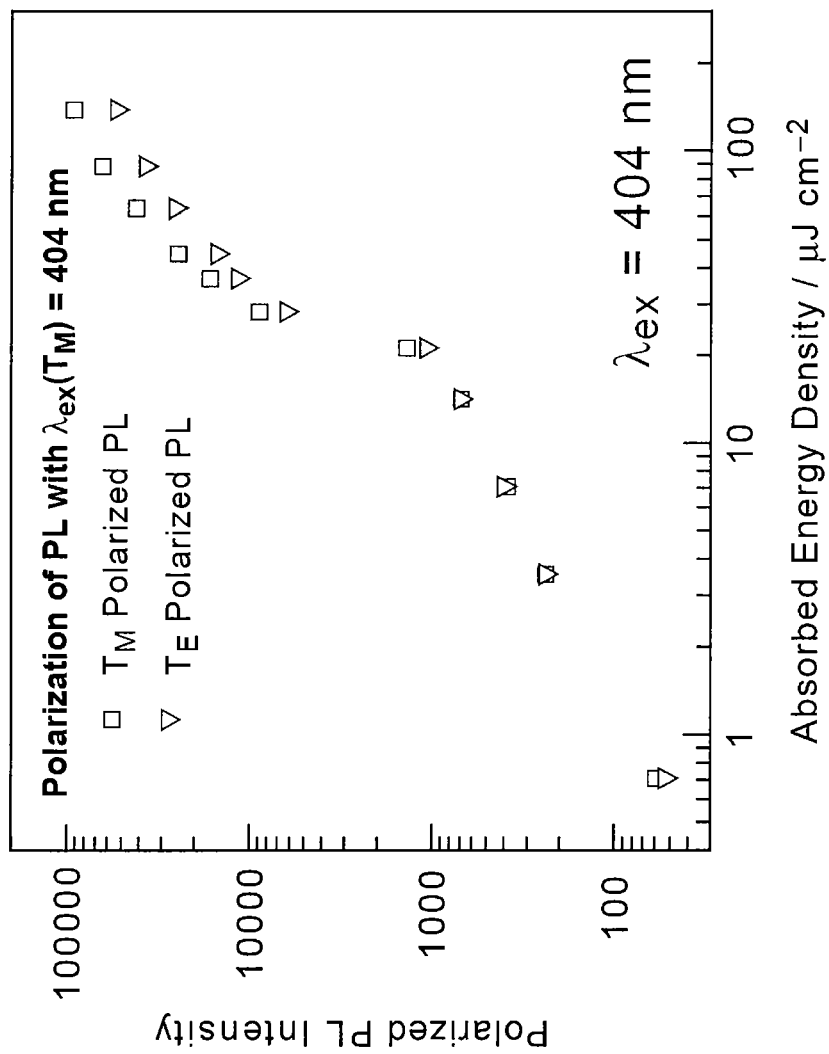
FIG. 6 shows the polarization of emission as a function of input power upon excitation at $\lambda_{ex}$ of about 404 nm.

FIG. 6 shows polarization of emission as a function of input power ($\lambda_{ex}$=404 nm). The PL intensity at emission peak is measured with collection polarizer oriented either parallel (TM, □) or perpendicular (TE, ∇) to the pump polarization. The PL intensity becomes 60% polarized co-linearly (TM) to the pump laser with increasing incident power. The emission is less polarized for 404 nm excitation because the FRET process scrambles the initial pump polarization.

Figure 7:
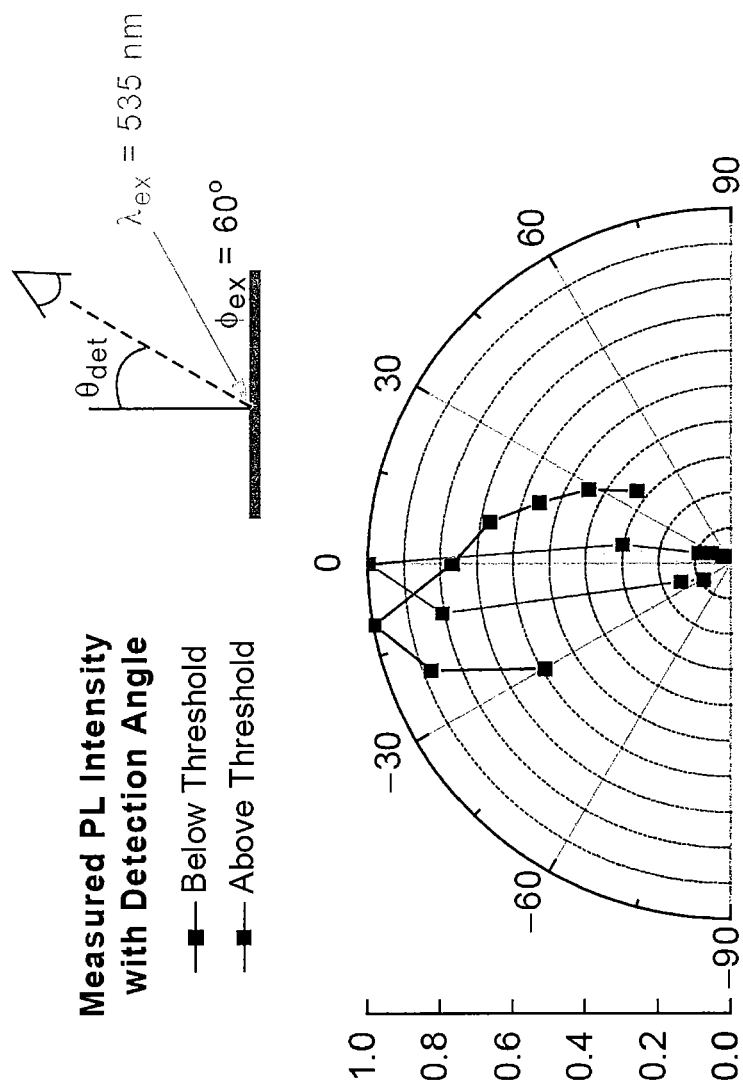
FIG. 7 is a polar plot depicting relative intensity of emission peak with detecting angle below and above threshold upon excitation at $\lambda_{ex}$ of about 535 nm.

FIG. 7 is the polar plot depicting relative intensity of emission peak with detection enable below and above threshold wavelength ($\lambda_{ex}$=535 nm). Diffuse directionality of PL peak is observed below threshold (2 μJ/cm$^2$) up to ±30° from normal. The directionality of PL narrows to ±5° from normal above threshold (1.7 μJ/cm$^2$).

Figure 8:
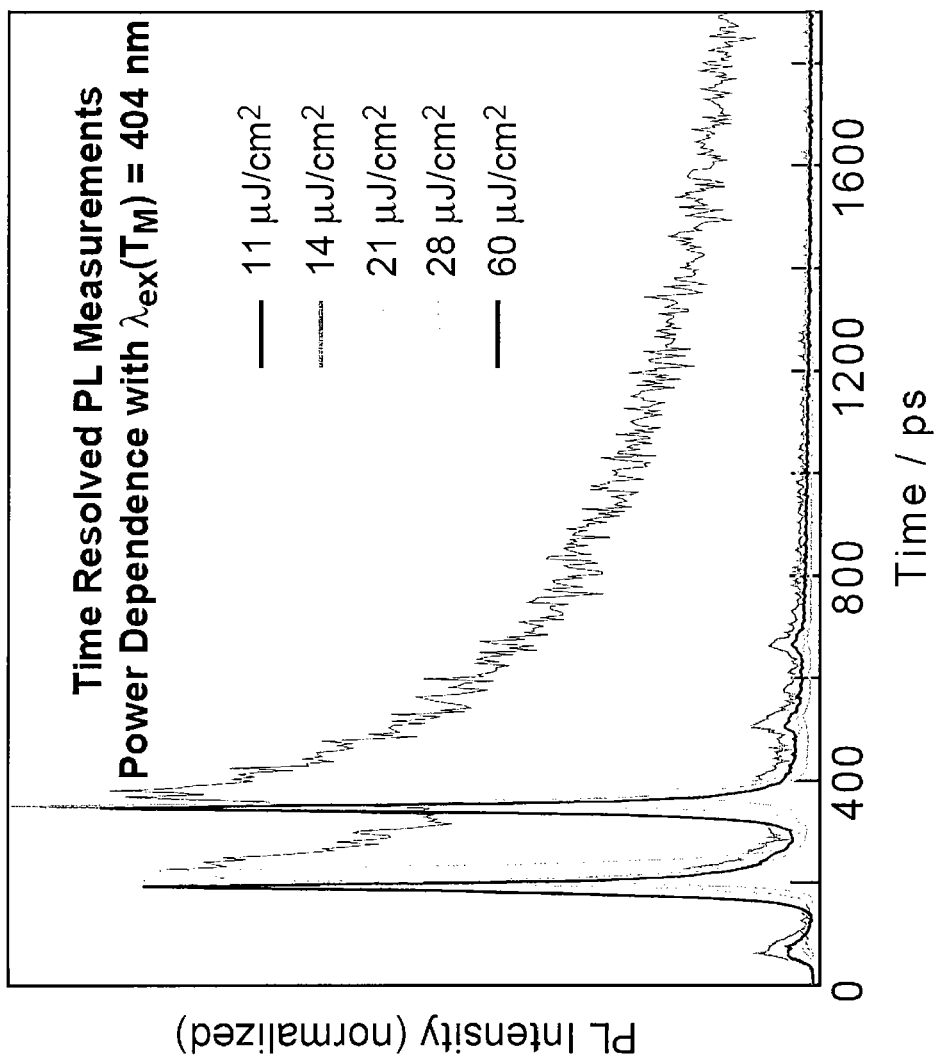
FIG. 8 shows the time resolved photoluminescence measurements power dependence with $\lambda_{ex}$(T.M) of about 404 nm.

FIG. 8 shows that when the pump excitation density is increased from 11 μJ/cm$^2$ to 14 μJ/cm$^2$, the temporal response of the PL changes markedly which further demonstrates the threshold behavior observed in the PL spectra taken using the spectrometer.

The time-resolved measurements reveal that above a threshold, the device emits pulses of coherent light at regular interval, with temporal features characteristic of gain switching and relaxation oscillation. In particular, FIG. 8 shows that the above the laser threshold the emission undergoes temporal beating. Up to five beats are observable with the first two being the most intense. These relaxation oscillations are remarkably well resolved temporally. This can be due to the device being pumped with 150 fsec instead of 500 psec pulses. The time delay between beats is 163 psec, independent of pump power. This beating was not observed where 150 fsec pulses were used to excite a high Q cavity sample filled with a 1.5λ thick gain layer of Alq3:DCM, and is also longer than the 100 psec oscillation period observed in certain conventional devices.

FIG. 8 also shows that with increased pump power, the durations of the laser bursts shorten in time from 29.8 psec (at 29 μW) down to 17.8 psec (at 85 μW), and at higher pump power, the first beat moves earlier in time. Similar burst shortening was observed in conventional devices, although relaxation oscillations were not reported. Such effects are signatures of gain switching in semiconductor microcavity lasers that are pulsed high above the threshold. The fact that there is burst shortening at threshold (and the beating is evident even below threshold), suggests that traditional gain switching (and relaxation oscillation) are not the sole for the observed laser dynamics. The background PL decay in the cavity, after the laser pulses peter out, has the same lifetime as free DCM doped into an Alq$_3$ film, which is not in a cavity.

Figure 9:
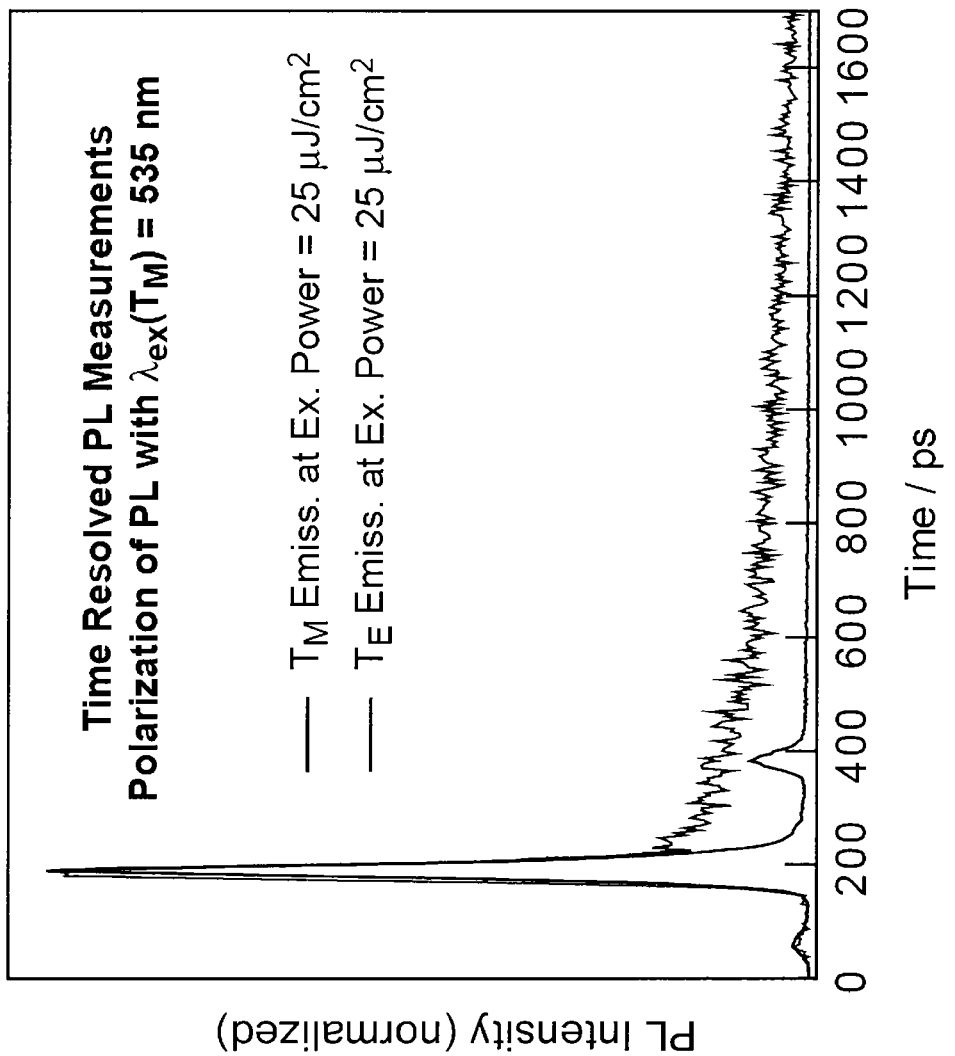
FIG. 9 shows the time resolved photoluminescence measurement polarization with $\lambda_{ex}$(T.M) of about 535 nm.

When 535 nm pump light was used to excite the sample, the time resolved spectra again showed temporal beating, although at most 2 beats are detected and only the first one is pronounced. This is shown in FIG. 9. Furthermore, the emission signal did not advance in time as the pump power was increased. The relative intensity of the PL signals for polarizations parallel to the pump was 19.5 times higher than the intensity for PL polarized perpendicular, which matched the ratio derived using standard PL spectra.

FIG. 9 shows the time-resolved polarization-selected microcavity PL ($\lambda_{ex}$=535 nm) above the laser threshold at 25 μJ/cm$^2$ incident power. Time-resolved TE (▬) and TM (▬) polarization-filtered emission captured in 2 ns window. Relativity intensity of TM signal is 19.5 times TE, the same ratio observed for steady-state polarized PL detection. The TM emission profile shows a similar beating pattern to that observed upon 404 nm excitation; however, fewer beats are observed. In time-resolved TE spectrum, only 22% of the emission is detected in the laser-like emission pulse, which constitutes 1% of the total collected light coming from the device. The spectrum obtained from integration over the first 100 psec exhibits line-narrowing matching the TM polarization spectra. The spectrum acquired from integrated of the remaining time interval a broadened spectrum similar to microcavity filtered DCM emission, below threshold.

Summary of lasting threshold results for our structure pumped using excitation at 404 nm and at 535 nm. A record low lasing threshold and power is observed for 535 nm pumping.

|  | Power (uW) | Energy (nJ) | % Abs | Spot-size (cm$^2$) | Threshold (J/cm$^2$) | Pulse Duration (fsec) | Threshold (W/cm$^2$) |
| --- | --- | --- | --- | --- | --- | --- | --- |
| 404 | 20 | 20 | 70.8% | 0.001 | 1.42E−05 | 150 | 9.43E+07 |
| 535 | 25 | 25 | 19.7% | 0.001 | 4.93E−06 | 150 | 3.28E+07 |

Figure 10:
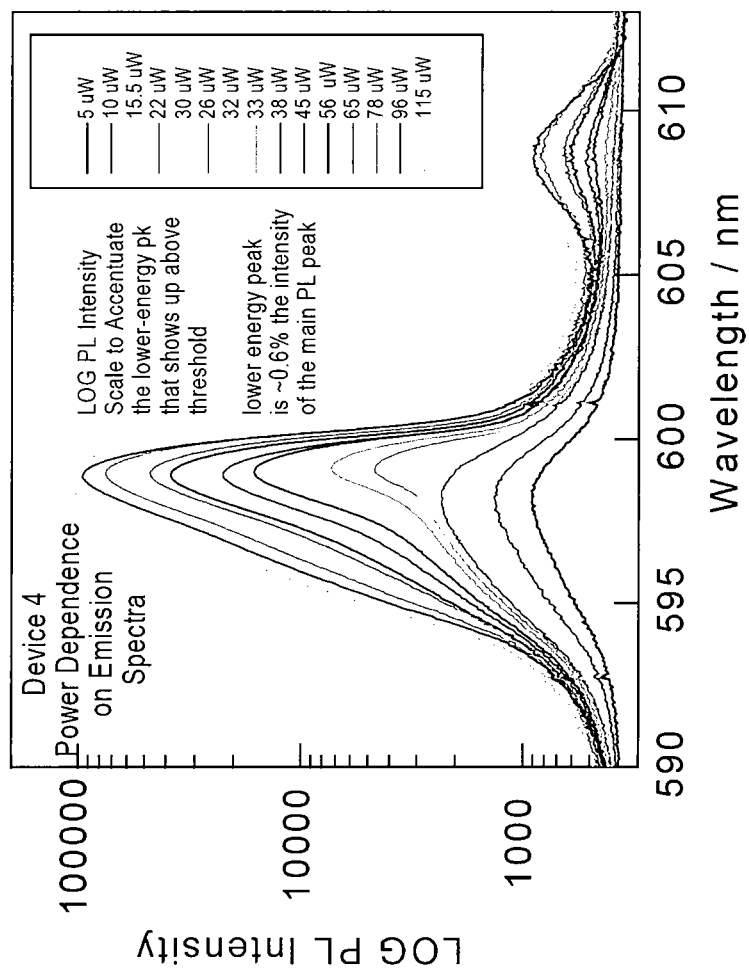
FIG. 10 shows the red-shifted peak in photoluminescence spectrum above threshold.

FIG. 10 is the RED-shifted peak in PL spectrum above threshold PL intensity plotted on LOG scale to accentuate the lower energy peak. The absorbed energy density (μJ/cm$^2$) is about 0.1970*Incident Power (μW) shown for excitation wavelength of about 535 nm.

Above threshold, a second emission pick was observed at λ=609 nm, which is red-shifted from the primary laser line at λ=600 nm. This PL peak is also linearly polarized and with the same polarization as the main laser line. The intensity of this peak is about 1% of the main laser line. Cavity thickness variation was ruled out as the cause for this emission peak because it was not observed below threshold. Also cavity variation may not be restricted to only two possible thicknesses and tunings. Instead, the emission peak appears to be the result of coherent processes, namely Bose-Einstein condensation amongst the emitting DCM molecules.

This peak is due to scattering out of the condensate state. The microcavity provides dispersion and hence a preferred point in the energy-dispersion relation for the DCM molecules to condense into. The coherent light emission means that the material gain matched absorption. This is a condensate of excitations in the first excited state. These excited DCM molecules are in (quasi) thermal-equilibrium with the lattice of the device. This is not equilibrium at zero energy, because the light and excited states are decaying away, but is instead a situation where the molecules have substantially the same temperature as the phonon bath. The excited states of DCM are actually condensing and hence emitting photons coherently.

The embodiments presented herein provide a novel organic semiconductor device that emits coherent light, in which the gain layer is only $\lambda/2n$ thick, and the microcavity consists of metal and dielectric mirrors with a modest Q of about 200. The function of this device indicates that exciton condensation is occurring. The extremely low threshold of 4.9 $\mu J/cm^2$, the polarization of the emission above threshold, temporal dynamics and surprising spectral features which appear above threshold indicate coherent excitonic processes are operative resulting in super-radiant enhancement of the DCM spontaneous emission.

The conventional demonstrations of laser action in solid state organic VCSEL structures have utilized either gain layers of at least 3 times the thickness or have relied on higher finesse all dielectric microcavities, in contrast to the modest quality factor of about 200 for the disclosed device. Lasing is confirmed by supra-linear input-output power dependence and by line narrowing above threshold. Moreover, when the optical excitation is polarized and the DCM is excited directly, the laser emission from the device strongly follows the polarization of the pump light. This polarization dependence is attenuated when the DCM is excited via FRET. The demonstration of laser action represents a 26-fold improvement in laser threshold over conventional devices that use similar gain and mirror materials. The observed threshold is 20 times lower than a calculation using the steady-state photoluminescence cross-section for DCM predicts, implying super-radiant enhancement of the emission. Time resolved spectra of the device support this hypothesis. Upon reaching threshold, a new emission peak emerges red-shifted 10 nm from the primary laser wavelength, further suggesting that the mechanism for the low threshold is super-radiant coherent coupling of the excited states of the DCM molecules due to excitonic condensation. The temperature dependence of the coherence threshold further confirms the condensation phenomenon, as do the temperature and concentration dependent streak camera data. The observed laser threshold of 4.9 $\mu J/cm^2$ corresponds to excitation of at most 1.0% of the DCM molecules, which suggests that laser action should be achievable with gain layer thicknesses of only 20 nm.

The limiting factor to achieving the condensation phenomenon is the need to pump the sample more quickly than the excited states lose their (polarization) coherence. In the above-disclosed experiment, all of the signatures of coherent light emission in these microcavities were observed. Specifically, supralinear input/output power dependence, polarized laser emission, line narrowing above lasing threshold, and increased PL directionality from the device were observed.

Since only 0.2% of the DCM molecules need to be excited at threshold, and the net thickness of the DCM is only 3.9 nm of the 156.7 nm total gain layer thickness, it follows that a gain layer of organic dye which is only a monolayer thick may be capable of producing lasing in a $\lambda/2$ cavity.

The time resolved data were critical for understanding how the operation of the disclosed device since little of the time dynamics were evident in the input/output power dependence. The temporal beating of the lasing as well as pulse shortening even when the sample is pumped at threshold, indicates that a macroscopic polarization is being induced which in turn reduces the threshold for lasing. This super-radiance can be thought of as mode-locking amongst the emitter molecules, which in the disclosed device is DCM.

The disclosed device also suggests that long range FRET may be possible to and from the DCM molecules. The condensation phenomenon, often referred to as Bose-Einstein Condensation in bulk systems or as a Kosterlitz-Thouless phase transition in 2-dimensional systems, was confirmed by several experiments, notably that the threshold for lasing is proportional to the system temperature.

Finally, we note that the presented $Alq_3$: DCM system is only one of a multitude of other solid state lasing dyes that can be deposited in a solid state thin film matrix and formed into $\lambda/2$ microcavities. Some examples of other lasing material systems are mentioned in "Study of lasing action based on Forster energy transfer in optically pumped organic semiconductor thin films," V. G. Kozlov, V. Bulovic, P. E. Burrows, M. Baldo, V. B. Khalfin, G. Parthasararathy, S. R. Forrest, Y. You and M. E. Thompson, Journal of Applied Physics, volume 84, number 8, page 4096, Oct. 15, 1998. The above article is incorporated by reference in its entirety herein for all purposes.

What is claimed is:

1. A method for forming a microcavity lasing device, the method comprising:
   depositing a dielectric Bragg reflector ("DBR") layer over a polished quartz substrate;
   thermally evaporating an organic gain layer having $Alq_3$ doped with the laser dye DCM 2.8%, the dye DCM of the organic gain layer being substantially a monolayer thick; and
   forming a silver mirror layer by thermal evaporation over the organic gain layer;
   wherein the organic gain layer having a thickness determined by the relationship $\lambda/2n$, where $\lambda$ is the excitation energy and n is the refractive index of the organic pain layer.

2. The method of claim 1, wherein the microcavity lasing device has a quality factor (Q) of about 200.

3. The method of claim 1, further comprising forming the DBR layer from a layer of $TiO_2$ and $SiO_2$.

4. The method of claim 3, wherein at least one of the $TiO_2$ and $SiO_2$ layers has a thickness of about $\lambda c/4n_i$, wherein $n_i$ is the refractive index for the respective layer.

5. The method of claim 1, wherein the step of depositing a dielectric Bragg reflector layer further comprises sputter coating 6-8 pairs of $TiO_2$ and $SiO_2$ layers.

6. The method of claim 1, wherein the organic gain layer is formed by co-evaporating $Alq_3$ and DCM.

7. The method of claim 1, wherein the saver mirror layer was deposited to a thickness of more than 300 nm.

8. The method of claim 1, wherein the silver mirror layer was deposited to a thickness of about 500 nm.

9. The method of claim 1, further comprising exciting the organic gain layer at about 600 nm wherein the organic gain layer has a refractive index of about 1.75.

10. The method of claim 1, wherein the thickness of the organic gain layer is determined as a function of the lasing device through the relationship $\lambda/2n=171.4$ nm.

11. The method of claim 1, wherein the device is pumped at a rate of about 140-200 fsec.

12. The method of claim 1, wherein the organic gain layer defines a center wavelength ($\lambda c$) of about 595-605 nm.

* * * * *